(12) United States Patent  (10) Patent No.: US 9,209,353 B2
Radermacher  (45) Date of Patent: Dec. 8, 2015

(54) LOW COST MOUNTING OF LEDS IN TL-RETROFIT TUBES

(75) Inventor: Harald Josef Günther Radermacher, Aachen (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 13/809,899

(22) PCT Filed: Jul. 12, 2011

(86) PCT No.: PCT/IB2011/053101
§ 371 (c)(1),
(2), (4) Date: Jan. 14, 2013

(87) PCT Pub. No.: WO2012/007899
PCT Pub. Date: Jan. 19, 2012

(65) Prior Publication Data
US 2013/0113002 A1  May 9, 2013

(30) Foreign Application Priority Data

Jul. 13, 2010 (EP) .................................... 10169408

(51) Int. Cl.
| *H01L 27/15* | (2006.01) |
| *H01L 33/36* | (2010.01) |
| *H01L 33/48* | (2010.01) |
| *F21S 4/00* | (2006.01) |
| *H01L 33/08* | (2010.01) |
| *F21K 99/00* | (2010.01) |
| *F21Y 101/02* | (2006.01) |
| *F21Y 103/00* | (2006.01) |

(52) U.S. Cl.
CPC . *H01L 33/08* (2013.01); *F21K 9/00* (2013.01); *F21K 9/17* (2013.01); *F21S 4/00* (2013.01); *H01L 27/153* (2013.01); *H01L 33/48* (2013.01); *F21Y 2101/02* (2013.01); *F21Y 2103/003* (2013.01); *Y02B 20/386* (2013.01)

(58) Field of Classification Search
None
See application file for complete search history.

(56) References Cited

U.S. PATENT DOCUMENTS

| 7,049,745 | B2 * | 5/2006 | Cok .............................. 313/512 |
| 7,478,925 | B2 * | 1/2009 | Hiyama et al. ........... 362/249.02 |
| 7,749,813 | B2 * | 7/2010 | Kolodin et al. ............... 438/125 |
| 2002/0008841 | A1 * | 1/2002 | Ohmuro ........................ 349/202 |
| 2002/0163791 | A1 * | 11/2002 | Hoelen et al. .................. 362/31 |
| 2005/0068471 | A1 * | 3/2005 | Aoyagi et al. .................. 349/62 |
| 2006/0171700 | A1 * | 8/2006 | Yang et al. ..................... 396/155 |
| 2008/0101071 | A1 | 5/2008 | Imai et al. |
| 2008/0121899 | A1 * | 5/2008 | Pires et al. ...................... 257/88 |
| 2009/0161359 | A1 * | 6/2009 | Siemiet et al. ................ 362/235 |
| 2010/0002437 | A1 | 1/2010 | Pang et al. |

(Continued)

FOREIGN PATENT DOCUMENTS

| JP | 2002133910 A | 5/2002 |
| JP | 200624416 | 1/2006 |

(Continued)

*Primary Examiner* — Johannes P Mondt
(74) *Attorney, Agent, or Firm* — Yuliya R. Mathis

(57) ABSTRACT

This invention relates to a lighting device comprising a light transmissive light outlet unit (102), and light emitting diodes (104) generating light which is emitted through the light outlet unit. The lighting device further comprises a conductive layer structure (114), which is arranged as a coating on a portion of an inner surface of the light outlet unit. The light emitting diodes are mounted on and electrically connected with the conductive layer structure.

5 Claims, 4 Drawing Sheets

(56) References Cited

U.S. PATENT DOCUMENTS

2010/0067225 A1 3/2010 Uang et al.
2010/0163892 A1 7/2010 Liu

FOREIGN PATENT DOCUMENTS

| | | |
|---|---|---|
| JP | 2007234470 A | 9/2007 |
| JP | 3156000 U | 12/2009 |
| WO | 2008031580 A1 | 3/2008 |
| WO | 2009040703 A2 | 4/2009 |
| WO | 2009112997 A1 | 9/2009 |
| WO | 2011027278 A1 | 3/2011 |
| WO | 2013088361 A1 | 6/2013 |

* cited by examiner

LOW COST MOUNTING OF LEDS IN TL-RETROFIT TUBES

FIELD OF THE INVENTION

The present invention relates to a lighting device comprising a light transmissive light outlet unit, and light emitting diodes (LEDs) generating light which is emitted through the light outlet unit.

BACKGROUND OF THE INVENTION

A typical example of devices within the present technical field is retrofitting fluorescent tube lamps (TL) with LEDs. Due to quite large mechanical dimensions of such a lamp the light generation component, i.e. the LEDs, have to be spread over quite some distance. Using common printed circuit board technology to mount the LEDs on board, or substrate, the very board adds undesired weight. In addition to LED tube lamps, there are other kinds and shapes of LED lamps having corresponding drawbacks.

SUMMARY OF THE INVENTION

It is an object of the present invention to provide a lighting device that alleviates the above-mentioned drawbacks of the prior art, and results in a lighter lighting device.

This object is achieved by a lighting device according to the present invention, and by a method of manufacturing a lighting device, as defined in the appended claims.

The invention is based on an insight that it is possible to provide a conductive layer structure directly on an inner surface of the light outlet unit and connect the LEDs to the structure, thereby excluding the board.

Thus, in accordance with an aspect of the present invention, there is provided a lighting device comprising a light transmissive light outlet unit, and light emitting diodes generating light which is emitted through the light outlet unit. The lighting device further comprises a conductive layer structure, which is arranged as a coating on a portion of an inner surface of the light outlet unit, wherein the light emitting diodes are mounted on and electrically connected with the conductive layer structure. The conductive layer structure can be divided into several traces. By using the conductive layer structure the board has been omitted from the device construction. Thereby the weight of the device becomes lower, and so does its cost. Furthermore, the amount of material used to build the lighting device is reduced, which effectively reduces the effort for recycling the device and the amount of resulting waste as well.

In accordance with an embodiment of the lighting device, the light emitting diodes are mounted on the conductive layer structure by means of a conductive medium. In other words the LEDs are mounted directly on the conductive layer structure by means of, inter alia, solder paste, a conductive adhesive, or the like.

In accordance with an embodiment of the lighting device, the conductive layer structure comprises a first electrode trace, which is connected with the first electrode of at least one of the light emitting diodes, and a second electrode trace, which is connected with the second electrode of at least one of the light emitting diodes and which is separated from the first electrode trace.

Thus, the traces are physically separated by a large enough distance in order to avoid shortcut. There are many different ways of arranging the respective first electrode and second electrode traces relative to the LEDs in order to obtain different kinds of electric interconnections, such as series connection and parallel connection, as will be explained by means of embodiments below.

In accordance with an embodiment of the lighting device, the conductive layer structure further comprises a first power connection trace connected with the first electrode trace, and a second power connection trace connected with the second electrode trace.

Thereby, a clear basic structure for external power connection is obtained, while the freedom of shaping the first electrode and second electrode traces is increased.

In accordance with an embodiment of the lighting device, the first power connection trace is connected with the first electrode trace via at least one ballast resistor. The conductive layer structure opens up for mounting directly thereon many kinds of additional circuits for preforming the power supplied to the LEDs.

In accordance with an embodiment of the lighting device, the conductive layer structure comprises at least one further trace for connecting at least one additional component. Thus, it is possible to add other kinds of components, to the interior of the light outlet unit in a simple way. For instance, an additional trace is a signal trace for a temperature sensor, or a power trace to connect external contacts, or to feed power from the external contacts to a rectifier.

In accordance with an embodiment of the lighting device, a phosphor layer is arranged on the inner surface of the light outlet unit, which phosphor layer converts light emitted by the light emitting diodes before being outlet through the light outlet unit. A typical example is color conversion, such as blue light-white light conversion, by means of the phosphor layer.

In accordance with another aspect of the present invention, the light outlet unit is tube shaped, and has opposite open ends, and the lighting device further comprises end caps. Each end cap closes a respective open end and comprises electric terminals, which are electrically connected with the conductive layer structure. This tube embodiment is an advantageous use of the coating solution according to this invention.

In accordance with another aspect of the present invention, there is provided a method of manufacturing a lighting device, which method comprises:
 providing a light transmissive light outlet unit;
 coating a portion of an inner surface of the light outlet unit with a conductive layer structure; and—mounting light emitting diodes on the conductive layer structure.

The method provides advantages similar to those provided by the lighting device as explained above.

According to an embodiment of the method the conductive layer structure is applied as a continuous structure, i.e. a single conductive trace, and then divide it into several separate conductive traces by means of a method of removing material at portions of the conductive layer structure. Useful methods of removal are for instance etching and laser working. However, according to another embodiment, it is also possible to apply the conductive layer structure as several separate traces.

These and other aspects, features, and advantages of the invention will be apparent from and elucidated with reference to the embodiments described hereinafter.

BRIEF DESCRIPTION OF THE DRAWINGS

The invention will now be described in more detail and with reference to the appended drawings in which.

DESCRIPTION OF PREFERRED EMBODIMENTS

Figure 1:
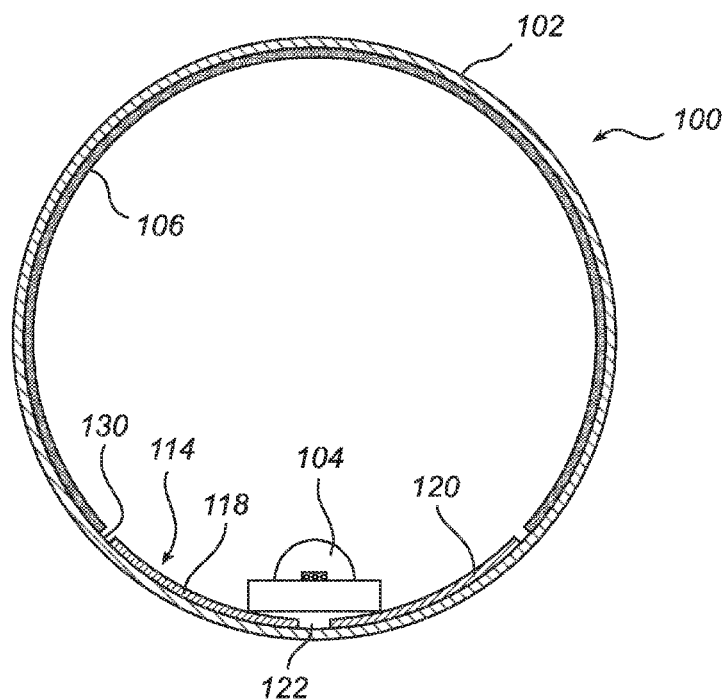
FIG. 1 in a cross-sectional view shows a portion of an embodiment of a lighting device according to the present invention.
Figure 2:
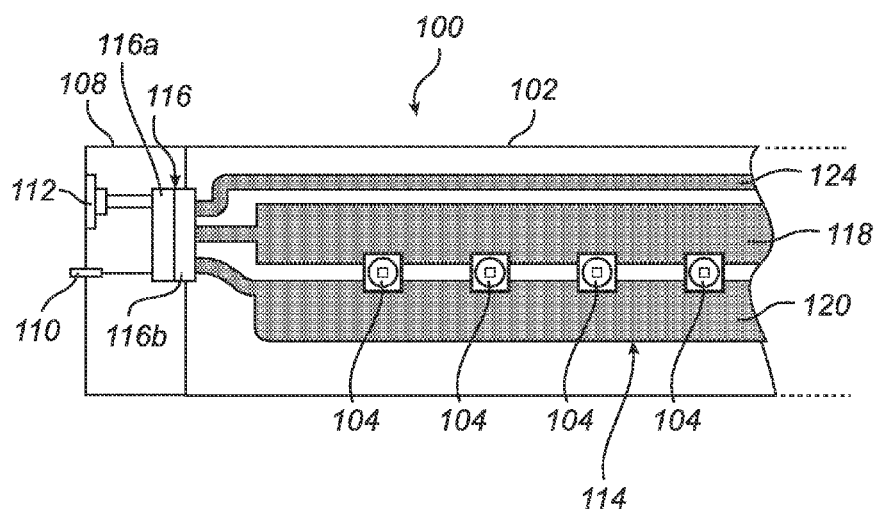
FIG. 2 shows the lighting device of FIG. 1 in a longitudinal sectional view.

Referring to FIGS. 1 and 2, the overall construction of a first embodiment of the lighting device is illustrated. The lighting device 100 comprising a tube shaped light transmissive light outlet unit 102, which is made of glass, but other materials are usable as well, such as some plastics. A conductive layer structure 114 is arranged on the inner surface 130 of the light outlet unit 102. The conductive layer structure 114 is a surface coating which covers a portion of the total inner surface 130, but leaves a large enough part of the inner surface 130 uncovered in order to provide a desired light distribution of the light which is output from the lighting device 100. The area of the conductive layer structure 114 may be comparable to that of a conventional circuit board. The lighting device 100 further comprises several light emitting diodes (LEDs) 104, which are mounted on the conductive layer structure 114. There are various types of LEDs available. In addition to the low voltage DC LED with a forward voltage in the range of 1.6 . . . 4V, there are also high voltage DC LEDs with a forward voltage of typically 50 . . . 200V, but also higher and lower voltages are possible. In addition to these DC LEDs, which have a dedicated anode and cathode contact, there are also AC LED packages and chips on the market, that have a internal structure that allows light generation upon current flow in either direction. Since these AC LEDs are not polarity dependent, there is typically no dedicated anode and cathode connection. Instead, these LEDs receive their power via two electrodes. For the sake of simplicity, the remainder of the document is written towards DC LED, consequently mentioning anode and cathode. When applying the proposed solution in combination with AC LEDs, the terms anode and cathode are to be understood as first and second electrical power input connection of the AC LED, irrespective of the polarity.

In the first embodiment the LEDs 104 are arranged in a row along the length of the light outlet unit 102. The LEDs 104 are electrically connected with the conductive layer structure 114. Preferably, the interconnection between the LEDs 104 and the conductive layer structure 114 as well as the conductive layer structure 114 per se are arranged to conduct heat, generated during operation of the LEDs 104, away from the LEDs 104, as explained later in more detail. Preferably, the attachment of the LEDs 104 on the conductive layer structure 114, and the electrical connection between them is obtained in conjunction by means of an appropriate conductive medium, as mentioned above.

The conductive layer structure 114 consists of one or more electrically and thermally conductive stacked layers, preferably made of metal, formed on the inner surface of the light outlet unit 102. Furthermore, the conductive layer structure 114 may comprise a highly reflective top layer. The reflective top layer causes a benefit of a directional light output. The LEDs 104 have been attached to the structure 114 by means of a conductive medium. Typically, solder paste has been applied to the surface at predetermined positions, and the LEDs 104 have been positioned in the solder paste, which has then been solidified by a heating-cooling procedure. The conductive layer structure 114 thus carries the LEDs 104. No further carrier is necessary. The conductive layer structure 114 comprises several conductive traces, including a first electrode trace, here an anode trace, 118, which is connected with the anodes of the LEDs 104, and a second electrode, here cathode, trace 120, which is connected with the cathodes of the LEDs 104. Thus, the LEDs 104 are connected in parallel. The anode and cathode traces 118, 120 are separated from each other by a gap 122. The anode and cathode traces 118, 120 are elongate and extend in parallel along the length of the light outlet unit 102. The conductive layer structure 114 comprises a further trace 124, which is elongate and extends in parallel with the anode and cathode traces 118, 120. The further trace 124 is a signal communication trace, and is used for signal communication with at least one other component, which is mounted in the light outlet unit 102, as will be exemplified in other embodiments below.

The conductive layer structure 114 will distribute, and transport to the tube wall, heat generated within the tube 102, such as heat generated by the LEDs 104. The material, the width, and the thickness of the conductive layer structure 114 have to be selected to serve both the electrical and thermal aspect of the application. When, for example, only a small number of LEDs 104 is used, heat is generated quite locally by the few LEDs 104. To achieve a good heat spreading, wider or thicker layers may be chosen than in a case with a very high number of LEDs dissipating a relatively lower power per LED.

The lighting device 100 further comprises end caps 108, closing the tubular light outlet unit 102. The end caps 108 are attached to the respective ends of the tube 102, sealing the tube 102 appropriately as well as providing electric terminals 110, 112 for external connection. Each electric terminal 110, 112 is externally accessible in form of a contact pin 110 or some other contact means 112 arranged at the cap 108, and it is connected with the conductive layer structure 114 via a single or multi-pole contact 116. One part 116a, i.e. male or female, of the multi-pole contact 116 is mounted on the inside of the end cap 108, and the complementary female/male part 116b is attached to the light outlet unit 102. The anode and cathode traces 118, 120 are respectively connected to associated pins of the contact part 116b, and the signal communication trace 124 is connected with the an associated pin of the contact part 116b.

Figure 7:
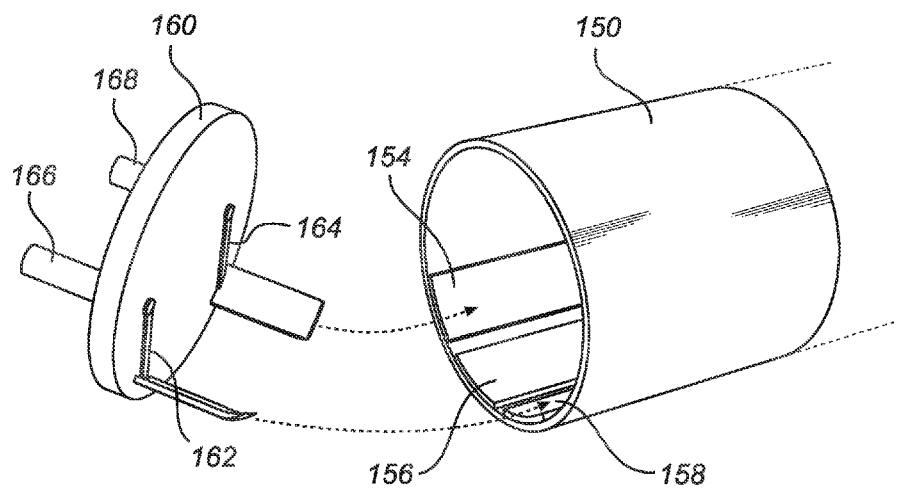
FIG. 7 is a cut away view showing an embodiment of the lighting device.

Alternatively, as schematically shown in FIG. 7 the contact is omitted, and the terminals 166, 168 are directly engaged with the conductive traces 154, 156, 158 of the light outlet unit 150. More particularly, the terminals 166, 168 are connected with tongues 162, 164 on the inside of the end cap 160, and the tongues 162, 164 extend into the light outlet unit 150 and abut the top surface of the traces 154, 156.

Depending on the electrical schematic, the terminals may be isolated from the rest of the circuit, may be interconnected, directly or via some intermediate circuitry, such as a resistor, or may be connected to additional traces, etc.

Furthermore, a light conversion layer 106 is provided on the inner surface 130 of the light outlet unit 102. The light conversion layer covers a portion of the inner surface 130. The light conversion layer 106 converts the light generated by the LEDs 104 in order to obtain a desired light output. For example, the LEDs 104 emit blue light, and the light conversion layer is a phosphor layer 106, which converts the blue light to white light. As an alternative, or additionally, the light conversion layer 106 is a light mixer and/or diffuser.

As regards the sealing between the end caps 108 and the light outlet unit 102, preferably the sealing is hermetic, although a less costly sealing with a minor degree of permeability is conceivable as well. In the latter case, however, an oxygen getter may be included in the cavity within the light outlet unit 102 in case organic phosphor is used for the light conversion layer 106. The electric terminals 110, 112 include at least power supply terminals 110, but signal communication terminals 112 can be additionally arranged.

Although understood by the skilled person, it should be noted that the LEDs emit light into a direction from where it can leave the lighting device through the light outlet unit, either directly or after reflection, and possibly after interaction with the light conversion layer, to serve as a light source. For example, the lighting device can be used for general illumination.

It should be noted that for reasons of simplicity and distinctness, FIGS. 3 to 6 show merely a mid portion of the light outlet unit, i.e. inter alia external connections at its ends have been omitted. Typically, for operating LEDs from the electrical power made available to the pins 110, 112, typically via the ballast in the lighting device, some manipulation of the electrical signal by means of rectifying, limiting, smoothing, etc. is required. Additional components may be required for this manipulation. The conductive layer structure can be used to interconnect these components.

There are different LEDs on the market, with different power levels and forward voltages. Depending on which LEDs are used and on desired voltage of interconnected pluralities of LEDs, parallel or serial connection of the LEDs may be required. Examples thereof will be evident from the embodiments described below.

Figure 3:
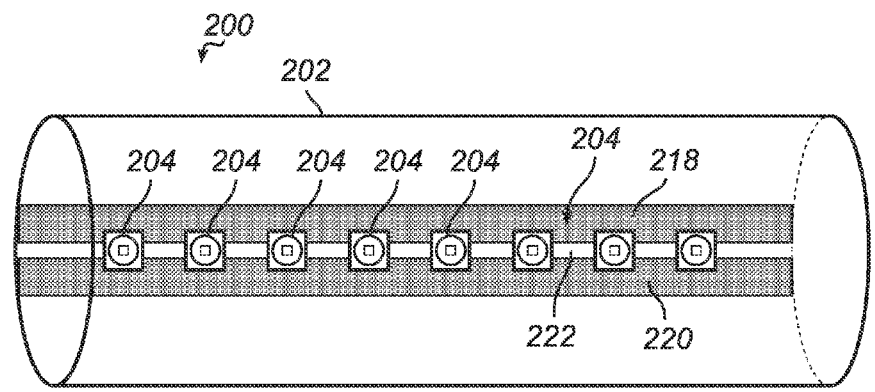
FIGS. 3 to 6 and 8 show different conductive layer structures and component arrangements according to different embodiments of the lighting device.

According to a second embodiment of the lighting device 200, as shown in FIG. 3, it comprises a tubular light transmissive light outlet unit 202. The light outlet unit 202 holds a longitudinal row of LEDs 204, and a conductive layer structure 214. The conductive layer structure 214 consists of an anode trace 218 and a cathode trace 220, which are elongate and extend in parallel, separated by a narrow strip shaped gap 222 which extends along the length of the tube 202. Each LED 204 is mounted across the gap 222 and connected with the anode trace 218 and the cathode trace 220. In this way the LEDs 204 are connected in parallel.

Figure 4:
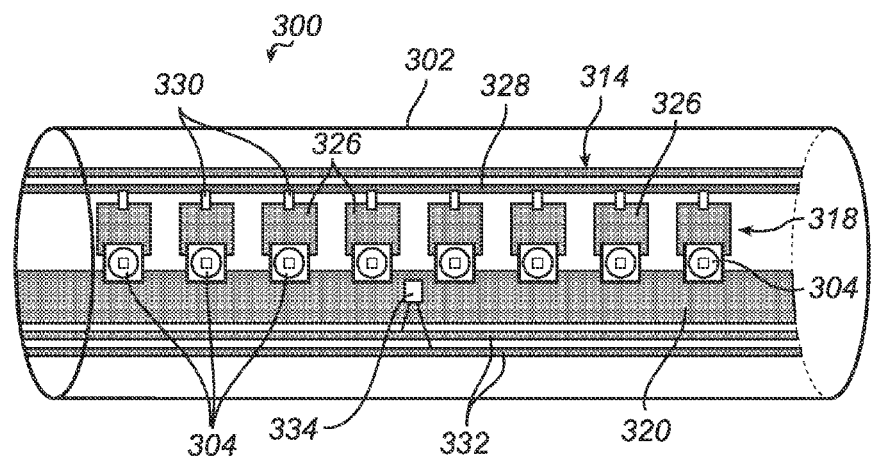

According to a third embodiment of the lighting device 300, shown in FIG. 4, which largely is similar to the second embodiment, the conductive layer structure 314 is differently arranged. The cathode trace 320 corresponds with that of the second embodiment. The anode trace 318, however, has been divided into individual trace portions 326, one individual trace portion 326 for each LED 304. A power connection trace 328, is arranged adjacent to the individual trace portions 326, and extends longitudinally of the light outlet unit 302. The power connection trace 328, and the cathode trace 320 are externally connected with a power supply. Each individual trace portion 326 is connected with the power connection trace via a ballast resistor 330. Furthermore, the conductive layer structure 314 comprises two additional traces 332, which are strip shaped and extend in parallel with and adjacent to the cathode trace 320. These additional traces 332 are signal communication lines, and they are connected with a temperature sensor 334, which is mounted on the cathode trace 320. Additionally, or alternatively, other components are arrangeable on the conductive layer structure 314 as well, such as for example IR (InfraRed) remote control circuitry, parts for the driver, such as a rectifier, or micro control components. For example, a photo diode can be placed somewhere along the tube while the controller receiving the information captured by the photodiode is positioned somewhere else, e.g. at an end of the light outlet unit, or at an end cap when end caps are used. Then one or some traces may conduct the photo signal information while others conduct the temperature sensor information.

The material, size, thickness and isolation distance of individual portions of one trace, or of multiple traces, are selected according to the voltage potential, current conduction requirement and thermal load required of the specific portion or trace.

Figure 5:
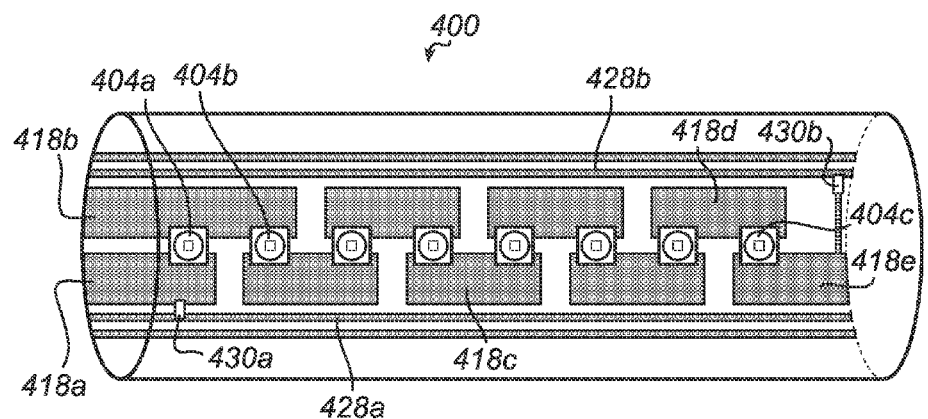

Referring to FIG. 5, according to a fourth embodiment of the lighting device 400, the LEDs are connected in series. Like in the previous embodiments the LEDs are mounted in a row. A first LED 404a thereof has the anode connected with an anode trace 418a, and the cathode connected to a first intermediate trace 418b. The anode trace 418a, in turn, is connected via a ballast 430a to a first power connection trace 428a. The anode of a second LED 404b is connected with the first intermediate trace 418b, and the cathode of the second LED 404b is connected with a second intermediate trace 418c, etc., until a last LED 404c, which is connected with a last intermediate trace 418d and with a cathode trace 418e, which in turn is connected via a ballast 430b to a second power connection trace 428b.

Figure 6:
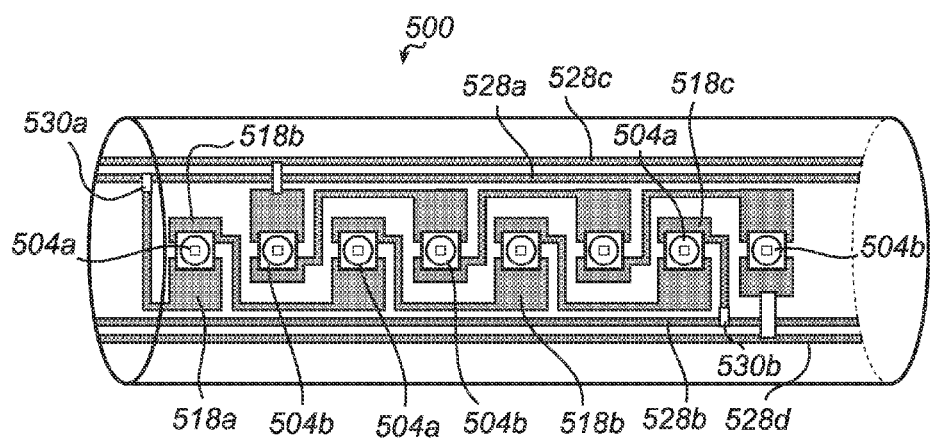

According to a fifth embodiment of the lighting device 500, as illustrated in FIG. 6, there is still a single row of LEDs, but there are two different chains of LEDs 504a, 504b within the row. Every second LED 504a belongs to a first chain and the other LEDs 504b belong to a second chain. The LEDs 504a, 504b are series connected within each respective chain. This grouping of the LEDs 504a, 504b in respective chains is done due to, for instance, voltage demands or types in general, or different colors in particular. There are four power connection traces 528a-528d, arranged two on either side of the LED row. The anode of the first LED 504a in the first chain is connected to an individual anode trace 518a, which is connected via a shunt resistor 530a to a first power connection trace 528a. The LEDs 504a within the first chain are interconnected via intermediate traces 518b. The last LED 504a of the first chain is connected to a cathode trace 518c, which is connected via a shunt resistor 530b to a second power connection trace 528b. Thus, for intermediate LEDs 504a of the first chain, two separate traces are arranged for each LED, one thereof being interconnected with a preceding LED and the other being interconnected with a following LED.

Figure 8:
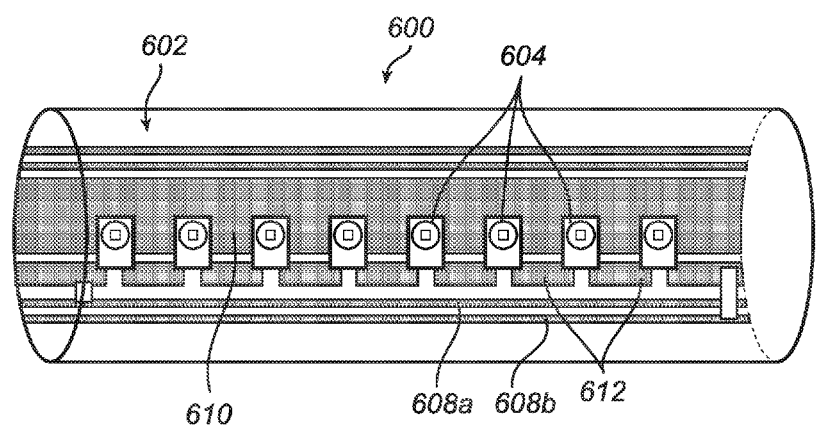

While in the above embodiments each LED is provided with two contacts, which serve for both the electrical and the thermal connection, some types of LEDs have a different structure. The LED has a separate solder contact for thermal, i.e. heat dissipation, purposes. This contact, often named the thermal pad or slug of the LED, has to be connected to the conductive layer structure too. Again depending on the type of LED, this contact has to be electrical isolated or may be or has to be connected with one or more of the electrical contacts. In case an isolated thermal pad is present at the LED, there could be a special, e.g. wide, thermal trace, while the electrical connection traces may be narrow. Hence, in accordance with a sixth embodiment of the lighting device 600, as shown in FIG. 8, the conductive layer structure 602 is divided into several traces including power connection traces 608a, 608b, and a thermal trace 610. The LEDs 604 are arranged in a row and they are series connected, such that the respective end most LEDs 604 are connected to respective first and second power connection traces 608a, 608b, and all LEDs are interconnected via intermediate traces 612. Furthermore, all LEDs 604 are connected with the thermal trace 610 via said thermal pads.

It should be noted that in particular in combination with higher power LEDs, the gaps, visible in FIG. 1, occurring in tubular embodiments, between the flat LED package and the curved coating, i.e. the conductive layer structure, should be filled with a thermally conductive material. Typically, the footprint of the LEDs is arranged such that solder can be used for this purpose without short circuiting the electrical contacts.

Below an embodiment of a method of manufacturing the lighting device will be described. A tubular light transmissive light outlet unit, preferably a common glass tube, is provided. A fraction of the inner surface of the tube is coated with an electrically and thermally conductive layer structure. After preparation steps like cleaning or activation the surface to be coated and protecting the surface not to be coated, this process might start e.g. with chemical baths to deposit silver. A first conductive layer can be deposited on a portion of the tube inner surface. Once this initial layer is present, a further layer, e.g. thicker copper, can be grown by electro coating. Copper would be beneficial in order to have a good heat spreading. In case reflective properties are required, a silver coating may be applied to cover the copper to produce a surface with high reflectivity.

This treatment will result in a conductive layer structure consisting of a single trace, which covers a certain portion of the inner surface of the light outlet unit. Then the conductive layer structure is divided into at least two electrically separated conductive traces, which will be employed as power supply traces or signal communication traces, or other desired kinds of traces, as described above. The division is performed, for instance, by etching or by means of a laser or by peeling off part of the coating, for example in these areas where the surface was protected to prevent coating, like mentioned above.

As an alternative, in case the conductive layer structure can be produced with sufficient accuracy to serve as one of the final traces, which for instance in some cases is elongate and narrow and requires relative high precision, the coating process is then repeated for the subsequent trace or traces.

Once the forming of traces has been finished, according to common SMD manufacturing technology, solder paste deposits are applied at predetermined positions, and components, i.e. LEDs and possibly other kinds of components as mentioned above, are mounted on the conductive layer structure, i.e. on the traces. That is, the components are placed on top of the solder paste deposits and engaged with them. This component mounting may require an adapted "long neck" solder paste dispenser and pick-and-place tool in order to reach into the tubular light outlet unit. Then, the complete arrangement is heated, e.g. by a reflow oven such as a vapor phase oven, and the components are soldered to the metallization, i.e. the conductive layer structure, in the tube.

In addition to the steps mentioned so far, according to embodiments of the method, also a phosphor layer, i.e. a remote phosphor coating, is applied to the inner surface of the part of the light outlet unit which serves as a light output portion of the tube, and which is not covered by the conductive layer structure.

In order to obtain closed tube embodiments, end caps are mounted at the ends of the tubular light outlet unit, and the interfaces between the end caps and the tube are sealed with an appropriate seal. In conjunction with the sealing, the inner space of the lighting device can be evacuated, and optionally filled with an inert gas. Electrical contacts at the end caps, as exemplified above, will be connected with complementary contacts at the ends of the light outlet unit, or brought into engagement with end portions of the conductive traces.

It should be noted that similar methods are used for manufacturing other kinds of lighting devices, having a non-tubular light outlet unit, such as flat large area lighting devices or ball-shaped light bulbs.

Above, embodiments of the lighting device, and the method of manufacturing the same, according to the present invention as defined in the appended claims have been described. These should be seen as merely non-limiting examples. As understood by a skilled person, many modifications and alternative embodiments are possible within the scope of the invention.

For example, additional conductive traces can be used for interconnecting the end caps in order to transport a voltage/current from one end cap to a rectifier at the other end cap.

The light outlet unit can be a part or portion of an overall structure including several other parts.

It is to be noted, that for the purposes of this application, and in particular with regard to the appended claims, the word "comprising" does not exclude other elements or steps, that the word "a" or "an", does not exclude a plurality, which per se will be apparent to a person skilled in the art.

The invention claimed is:

1. A lighting device comprising
a tube shaped light transmissive light outlet unit,
a plurality of light emitting diodes generating light which is emitted through the light outlet unit and electrically connected to a conductive layer structure by a conductive medium,
the conductive layer structure, arranged as a coating on a portion of an inner surface of the light outlet unit,
the light emitting diodes mounted on and electrically connected with the conductive layer structure,
the plurality of light emitting diodes positioned in a single row on the inner surface of the light outlet unit;
the plurality of light emitting diodes divided into a first chain of light emitting diodes and a second chain of light emitting diodes within the row;
the conductive layer structure including a plurality of power connection traces on the inner surface of the light outlet unit;
the first chain of light emitting diodes connected in series and electrically connected to a first and second power connection trace;
the second chain of light emitting diodes connected in series and electrically connected to a third and fourth power connection trace;
the light emitting diodes of the first chain are alternatively interspersed with the light emitting diodes of the second chain.

2. The lighting device according to claim 1, wherein the first power connection trace is connected with the first chain of light emitting diodes via at least one shunt resistor.

3. The lighting device according to claim 1, wherein a phosphor layer is arranged on the inner surface of the light outlet unit, which phosphor layer converts light emitted by the light emitting diodes before leaving the light outlet unit.

4. The lighting device according to claim 1, wherein the light outlet unit has opposite open ends, and wherein the lighting device further comprises end caps, each closing a respective open end and comprising electric terminals, which are electrically connected with the conductive layer structure.

5. A lighting device, comprising:
a tube shaped light transmissive light outlet unit,
a plurality of light emitting diodes generating light which is emitted through the light outlet unit and electrically connected to a conductive layer structure by a conductive medium, the conductive layer structure arranged as a coating on a portion of an inner surface of the light outlet unit;

the plurality of light emitting diodes positioned in a single row on the inner surface of the light outlet unit;

the plurality of light emitting diodes electrically connected in series;

the conductive layer structure including a plurality of power connection traces on the inner surface of the light outlet unit;

a thermal trace positioned on the inner surface of the light outlet unit and adjacent the plurality of light emitting diodes;

a first light emitting diode connected electrically to a first power connection trace;

a last light emitting diode connected electrically to a second power connection trace;

each of the plurality of light emitting diodes thermally connected to the thermal trace;

the thermal trace electrically isolated from the first and second power connection trace.

* * * * *